(12) United States Patent
Broekaart et al.

(10) Patent No.: US 8,232,130 B2
(45) Date of Patent: Jul. 31, 2012

(54) PROCESS FOR ASSEMBLING WAFERS BY MEANS OF MOLECULAR ADHESION

(75) Inventors: Marcel Broekaart, Theys (FR);
Bernard Aspar, St Ismier (FR); Thierry Barge, Grenoble (FR); Chrystelle L. Blanchard, Crolles (FR)

(73) Assignee: S.O.I.TEC Silicon on Insulator Technologies, Bernin (FR)

( * ) Notice: Subject to any disclaimer, the term of this patent is extended or adjusted under 35 U.S.C. 154(b) by 1014 days.

(21) Appl. No.: 12/229,248

(22) Filed: Aug. 21, 2008

(65) Prior Publication Data

US 2009/0280595 A1 Nov. 12, 2009

(30) Foreign Application Priority Data

May 6, 2008 (FR) ...................... 08 52990

(51) Int. Cl.
*H01L 21/50* (2006.01)
*H01L 31/00* (2006.01)
(52) U.S. Cl. ........... 438/66; 257/E21.499; 257/E31.001; 438/455
(58) Field of Classification Search .................. None
See application file for complete search history.

(56) References Cited

U.S. PATENT DOCUMENTS

| | | | |
|---|---|---|---|
| 5,131,968 | A | 7/1992 | Wells et al. |
| 5,843,832 | A | 12/1998 | Farmer et al. |
| 6,429,094 | B1 | 8/2002 | Maleville et al. |
| 2007/0207566 | A1 | 9/2007 | Fu et al. |

FOREIGN PATENT DOCUMENTS

| | | |
|---|---|---|
| JP | 02056918 | 2/1990 |
| WO | WO-2007047536 | 4/2007 |

OTHER PUBLICATIONS

Philips Journal of Research; vol. 49; No. 1/2; 1995, "Silicon-Wafer Fabrication and (Potential) Applications of Direct-Bonded Silicon."
IEEE Transactions on Electron Devices; vol. 53; No. 10; Oct. 2006, "A Wafer-Scale 3-D Circuit Integration Technology."
Kevin T. Turner, Sathish Veeraraghavan and Jaydeep K. Sinha, "Predicting Distortions and Overlay Errors Due to Wafer Deformation During Chucking on Lithography Scanners," J. Micro/Nanolith. MEMS MOEMS, Oct.-Dec. 2009; vol. 8(4).
K. T. Turner and S. M. Spearing, "Modeling of Direct Wafer Bonding: Effect of Wafer Bow and Etch Patterns," Journal of Applied Physics, Dec. 15, 2002; vol. 92, No. 12.
K. T. Turner, M. D. Thouless and S. M. Spearing, Mechanics of Wafer Bonding: Effect of Clamping, Journal of Applied Physics, Jan. 1, 2004; vol. 95, No. 1.

(Continued)

*Primary Examiner* — Allan Olsen
(74) *Attorney, Agent, or Firm* — Edwards Wildman Palmer LLP; George W. Neuner; George N. Chaclas

(57) ABSTRACT

The invention relates to a process of bonding by molecular adhesion of two layers, such as wafers of semiconductor material, wherein propagation of a first bonding wave is initiated from a pressure point applied to at least one of the two layers, and wherein the first bonding wave step is followed by propagating a second bonding wave over an area, for example, in the vicinity of the pressure point. Propagation of the second bonding wave may be obtained through the interposing of a separation element between the two wafers and the withdrawal of the element, for example, after the beginning of the first bonding wave propagation.

13 Claims, 5 Drawing Sheets

OTHER PUBLICATIONS

Hyun-Joon Kim-Lee, Michael R. Rupek and Kevin T. Turner, "Capillary Assisted Alignment for High Density Wafer-Level Integration," Conference of Wafer Bonding for MEMS and Wafer-Level Integration, Dec. 10, 2007, Slide 1-26, University of Wisconsin at Madison.

Hiroshi Horie, Shunji Nakamura, Yasuo Nara, Kunihiro Suzuki, Tetsu Tanaka, Masahiko Imai, Akio Itoh and Yoshihiro Arimoto, "Advanced SOI Devices Using CMP and Wafer Bonding," Fujitsu Laboratories Ltd., pp. 473-475, Atsugi, Japan.

Steven E. Steen, Douglas Latulipe, Anna W. Topol, David J. Frank, Kevin Belote and Dominick Posillico, "Overlay as the Key to Drive Wafer Scale 3D Integration," MicroElectronic Engineering, pp. 1412-1415; www.elsevier.com/locate/mee on Feb. 9, 2007.

Min et al: "Effects of Wafer Cleaning and Annealing on Glass/Silicon Wafer Direct Bonding," Transactions of the ASME; Journal of Electronic Packaging; Mar. 2004; vol. 126, pp. 120-123.

Rapport De Recherche Préliminaire (French Search Report) dated Jan. 15, 2009.

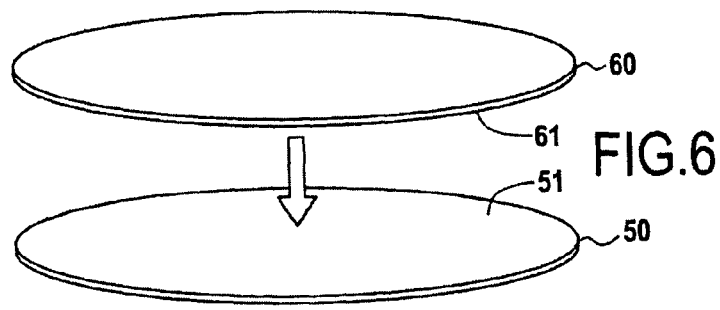
FIG.6
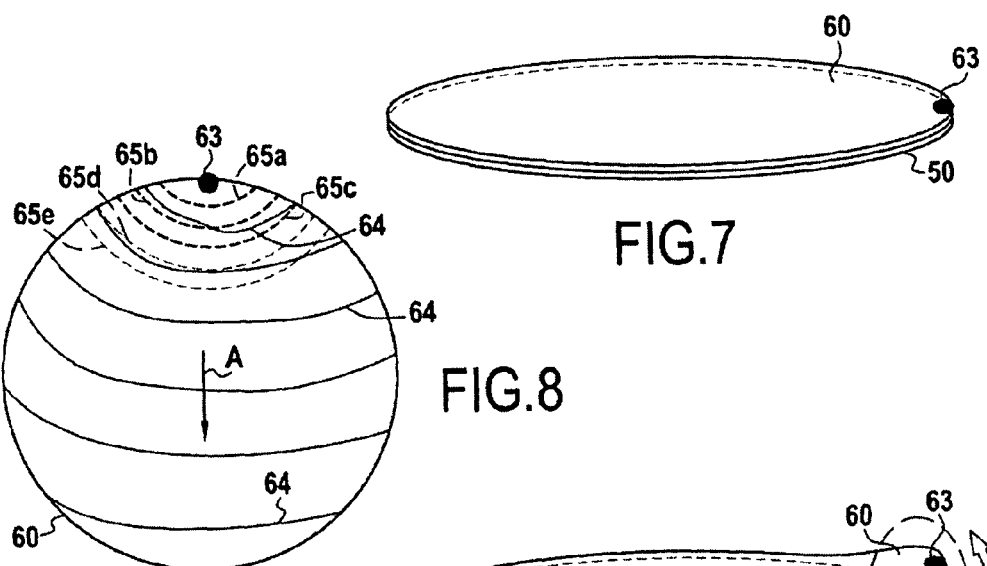
FIG.7
FIG.8
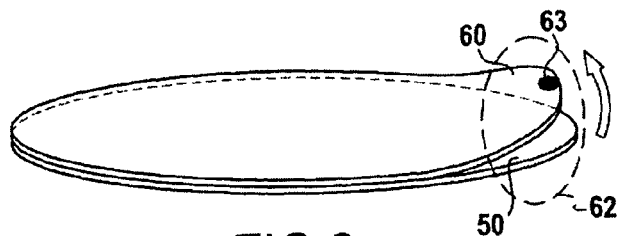
FIG.9
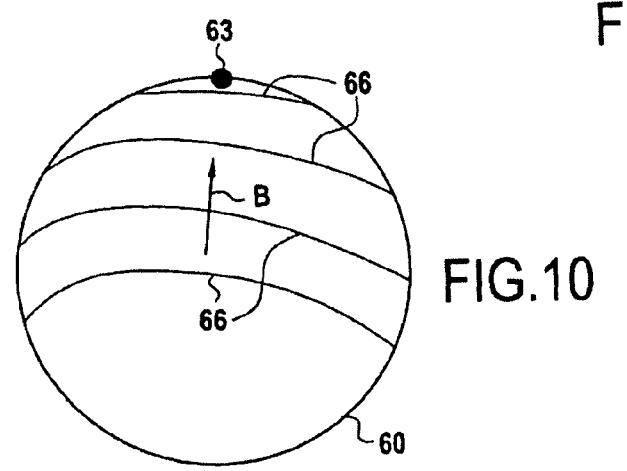
FIG.10

PROCESS FOR ASSEMBLING WAFERS BY MEANS OF MOLECULAR ADHESION

CROSS-REFERENCE TO RELATED APPLICATION

This application claims the benefit of priority from French Patent Application Serial No. FR0852990 filed May 6, 2008. The disclosure of this application is incorporated by reference herein in its entirety.

BACKGROUND OF THE INVENTION

1. Field of the Invention

The present invention relates to the field of the production of wafers or multilayer semiconductor substrates (also called "multilayer semiconductor wafers") effected by the transfer of at least one layer formed from an initial substrate onto a final substrate where the layer transferred corresponds to a portion of the initial substrate. The layer transferred may also include all or part of a component or a number of microcomponents.

2. Description of Related Art

More specifically, this invention relates to the problem of heterogeneous distortions that appear when transferring a layer from a substrate called the "donor substrate" onto a final substrate called the "receiver substrate". Such distortions have been observed in the case of three-dimensional integration technology of components (3D integration) which requires the transfer of one or more layers of microcomponents onto a final substrate but also in the case of the transfer of circuits as well as in the manufacture of backside-illuminated imagers. The layer(s) transferred include(s) microcomponents (electronic, optoelectronic, etc.) produced at least in part on an initial substrate. These layers are then stacked onto a final substrate which may itself include additional components. Especially because of the very small size and the large number of microcomponents on a given layer, each layer transferred must be positioned on the final substrate with considerable precision in order to observe very accurate alignment with the underlying layer. In addition, it may be necessary to carry out processing on a layer after its transfer, for example, to form other microcomponents, to bring microcomponents to the surface, to make interconnections, and the like.

However, applicant has found that after the transfer, there are cases where it is very difficult, if not impossible, to form additional microcomponents in alignment with microcomponents formed before the transfer. This phenomenon of misalignment is described in reference to FIGS. 1A to 1E which show an example of the production a three-dimensional structure including the transfer onto a final substrate, a layer of microcomponents formed on an initial substrate and the formation of an additional layer of microcomponents on the exposed surface of the initial substrate after bonding. FIGS. 1A and 1B show an initial substrate 10 on which is formed a first series of microcomponents 11. The microcomponents 11 are formed by photolithography using a mask to define the areas of formation of patterns corresponding to the microcomponents 11 to be produced.

As shown in FIG. 1C, the face of the initial substrate 10 including the microcomponents 11 is then brought into direct contact with one face of a final substrate 20. The bonding between the initial substrate 10 and the final substrate 20 is usually made by molecular adhesion. One thus obtains a buried layer of microcomponents 11 at the bonding interface between substrates 10 and 20. After bonding and as shown in FIG. 1D, the initial substrate 10 is thinned down to remove a portion of the material lying above the layer of microcomponents 11. One then obtains a composite structure 30 consisting of the final substrate 20 and a layer 10a corresponding to the remaining portion of the initial substrate 10.

As shown in FIG. 1E, the next step in the production of the three-dimensional structure is to form a second layer of microcomponents 12 on the exposed surface of the thinned-down initial substrate 10, or to carry out additional technological processes on the exposed surface, aligned with the components included in the layer 10a (making contacts, interconnections, etc.). For simplicity, we will use the term "microcomponents" in the following text to refer to the devices formed as a result of the technological processes undertaken in or on the layers, and the positioning of which must be controlled with precision. These components may thus be active or passive, merely making contact or representing interconnections.

Thus, in order to form the microcomponents 12 in alignment with the buried microcomponents 11, one uses a photolithographic mask similar to the one used to form the microcomponents 11. The layers transferred, such as the layer 10a, typically include marks with respect to both the microcomponents and the wafer forming the layer and which are used especially by the tools for positioning and alignment during the stages of technological processing such as those implemented during photolithography.

However, even when using positioning tools, misalignment may occur between some of the microcomponents 11 and 12 resulting in misalignments $\Delta 11, \Delta 22, \Delta 33, \Delta 44$, shown in FIG. 1E (corresponding to the observed discrepancies between the pairs of microcomponents 111/121,112/122, 113/123 and 114/124). These misalignments are due to heterogeneous distortions which appear in the layer coming from the initial substrate during its assembly with the final substrate. The distortions result in the displacement of some microcomponents 11. In addition, some microcomponents 12 formed on the exposed surface of the substrate after transfer, show variations in position with respect to the microcomponents 11 which may be in the order of several hundred nanometers or even microns.

This phenomenon of misalignment (also called "overlay") between the two layers of microcomponents 11 and 12 may be a source of short circuits, distortions in the stacking, or faulty connection between the microcomponents of the two layers. This phenomenon of misalignment thus leads to a reduction in the quality and the value of the multilayer semiconductor wafers manufactured. The impact of this phenomenon is becoming increasingly critical due to the steadily increasing requirements with respect to the miniaturization of microcomponents and their integration density per layer.

The alignment problems in the manufacture of three-dimensional structures are well known. The document Burns et al. titled "LiA Wafer—Scale 3-D Circuit Technology Integration", IEEE Transactions On Electron Devices, vol. 53, No. 10, October 2006, describes a method to detect variations in alignment between bonded substrates. The document Haisma, et al. "Silicon-Wafer Fabrication And (Potential) Applications Of Direct-Bonded Silicon", Philips Journal of Research, Vol. 49, No. V2, 1995, stresses the importance of the flatness of the plates especially during the polishing steps in order to obtain good quality final wafers, i.e. with the least possible distortions between microcomponents. It is not desirable to introduce distortions in a heterogeneous substrate during its transfer onto another substrate.

The present invention provides a solution to these problems.

SUMMARY OF THE INVENTION

The purpose and advantages of the present invention will be set forth in and become apparent from the description that follows. Additional advantages of the invention will be realized and attained by the methods and systems particularly pointed out in the written description and claims hereof, as well as from the appended drawings.

Generally, the invention provides a solution to limit distortions which appear in a non-homogeneous substrate when transferred onto another substrate. To this end, this invention proposes a bonding method by molecular adhesion of two wafers or substrates including the steps of bringing the surfaces of the wafers to be assembled into at least partial contact, causing propagation of a first bonding wave from a point of pressure applied to at least one of the two wafers, and then causing propagation of a second bonding wave applied to a zone, for example, at least in the vicinity of the point of pressure.

In accordance with a further aspect of the invention, following propagation of a first bonding wave as is usually effected to bring about molecular adhesion, the propagation of a second bonding wave at an area at least in the vicinity of the point of pressure reduces the heterogeneous distortions engendered in the wafer through the initiation of the first bonding wave while obtaining molecular adhesion over all the surfaces of the two wafers in contact. Advantageously, by minimizing the distortions caused by the application of the point of pressure when bonding by molecular adhesion, it is possible to considerably reduce the risk of misalignment (or "overlay") during the later formation of microcomponents on additional layers.

In accordance with a further aspect, the point of pressure may be applied preferably near the edge of one of the two wafers to allow a first bonding wave propagation over a long distance and thus to form an area with virtually no distortion in the part opposite the point of pressure.

In accordance with still a further aspect, prior to initiating propagation of the first bonding wave, a separation element may be interposed between the surfaces of the wafers to be assembled. The separation element may be removed to initiate propagation of the second bonding wave. In accordance with one embodiment, after initiating the first wave but before initiating the second wave, the separation element may be moved inwards between the wafers so as to partially open the bonding interface formed during propagation of the first bonding wave.

According to another aspect, the plates may be brought completely into contact prior initiating the first bonding wave. In accordance with this embodiment, before initiating the second bonding wave, surfaces of the assembled wafers may be unbonded in an area located at least in the vicinity of the point of pressure. Next, the surfaces may be brought into contact once again in order to initiate propagation of the second bonding wave. The surfaces of the assembled wafers are preferably unbonded in an area including the point of pressure which helps to favor the easing of constraints in this area.

The invention also provides a process for production of a composite three-dimensional structure. The structure includes a stage for production of a first layer of microcomponents on one side of a substrate and a stage for bonding the face of the first substrate carrying the first layer of microcomponents onto a second substrate, wherein the first and second substrates are assembled in accordance with the assembly process of the invention.

The use of the assembly process of this invention allows, when transferring a layer of microcomponents, the elimination or minimization of the misalignment phenomenon ("overlay") and permits the production of high quality multilayer semiconductor wafers. The layer of microcomponents may in particular include image sensors, as well as other devices. In the case of image sensors, the material of the second substrate is preferably a transparent material such as silica or quartz.

In further accordance with the invention, a product is provided in accordance with the teachings herein. The product can include an electronic device, an optical device, or an optoelectronic device, among others.

It is to be understood that both the foregoing general description and the following detailed description are exemplary and are intended to provide further explanation of the invention claimed. The accompanying drawings, which are incorporated in and constitute part of this specification, are included to illustrate and provide a further understanding of the methods and systems of the invention, and the products that may be produced therewith. Together with the description, the drawings serve to explain the principles of the invention.

BRIEF DESCRIPTION OF THE DRAWINGS

FIGS. 6 to 10 are schematic views of an assembly process by molecular adhesion in accordance with an embodiment of the invention;

DETAILED DESCRIPTION OF THE PREFERRED EMBODIMENT

Figure 1A:
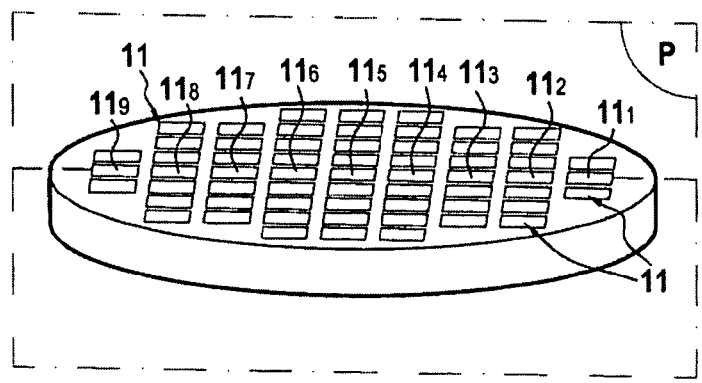
FIGS. 1A-1E are schematic views showing the production of a three-dimensional structure according to the prior art.
Figure 1B:
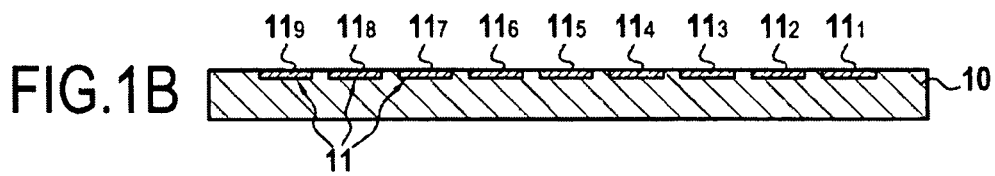
Figure 1C:
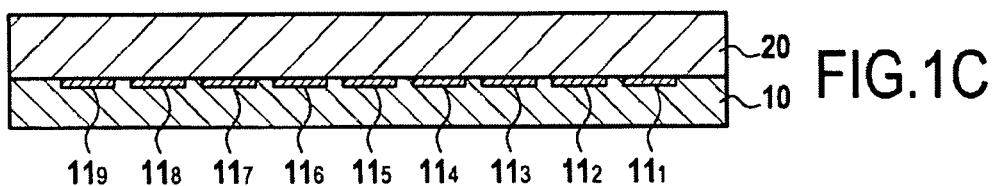
Figure 1D:
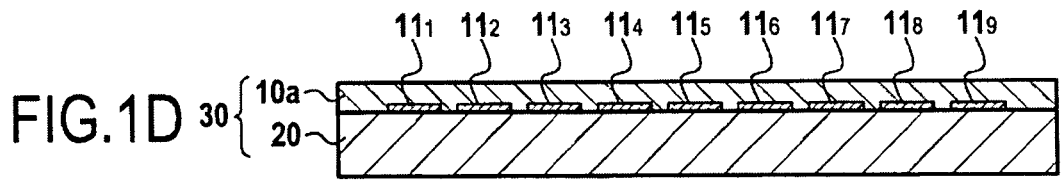
Figure 1E:
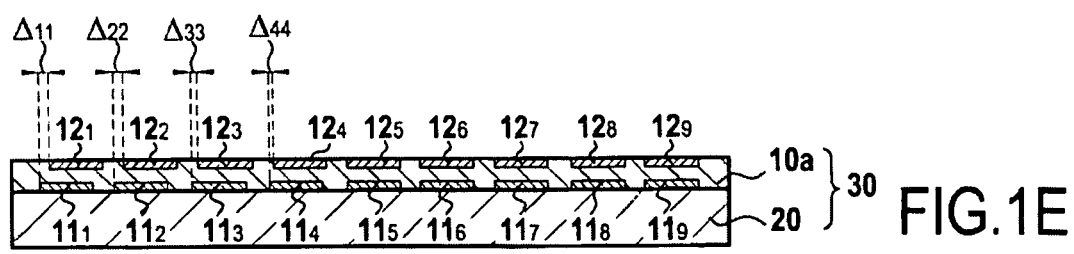

Reference will now be made in detail to the present preferred embodiments of the invention. The method and corresponding steps of the invention will be described in conjunction with the detailed description of the system and product obtained.

This invention applies generally to the production of composite structures including at least a bonding by molecular adhesion of a first substrate or wafer onto a second plate substrate or wafer. Bonding by molecular adhesion is a well-known technique. The principle of bonding by molecular adhesion is based on the direct contact of two surfaces, (i.e. without the use of a specific material (glue, wax, solder, etc.)). Bonding operations require that the surfaces are sufficiently smooth, free of particles and contamination, and that the surfaces are sufficiently close to one another to allow contact to be initiated, typically at a distance of less than a few nanometers. When brought into such proximity, the forces of attraction between the two surfaces are sufficiently high to cause molecular adhesion (bonding induced by all of the forces of attraction (i.e., Van Der Waals forces) of the electronic interaction between the atoms or the molecules of the two surfaces to be bonded).

The initiation of the molecular adhesion is typically achieved by application of localized pressure, for example, using a Teflon® stylus on a wafer in close contact with another wafer in order to trigger propagation of the bonding wave from this point of initiation. One uses the term "bonding wave" to refer to the front of the bond or the molecular adhesion spreading from the point of initiation and corresponding to the dissemination of the forces of attraction (i.e., "Van Der Waals forces") from the point of initiation over the entire surface of close contact between the two wafers (i.e., the "bonding interface").

Applicant has demonstrated that relative displacement occurs between certain patterns or microcomponents in the same substrate at the stage of bonding of this substrate onto another by molecular adhesion. More specifically, experiments carried out by Applicant have shown that constraints (e.g., of tension and/or compression) are generated at the point of initiation of bonding by molecular adhesion (i.e., the point at which pressure is applied). These constraints are the basis for the heterogeneous distortions appearing in the substrate and, therefore, cause relative and unequal displacements of certain patterns of microcomponents to take place with respect to one another. Applicant has discovered that the aforementioned distortions are mainly located in and around the initiation point, or beginning, of bonding and that these strains are elastic. These distortions may spread over a radius of up to 15 cm around the point of application of pressure.

However, in the part of the substrate remote from the point of initiation, i.e. in the part where the bonding wave is propagated, the observed distortions are minimal. It is believed that the location of the distortion at the initiation point is largely explained by the fact that this area corresponds to that point where pressure is applied to initiate the bonding wave. The application of localized pressure creates constraints which decrease as one moves away from the point of application of the pressure.

Accordingly, in accordance with the invention, methods are provided for controlling the process of molecular adhesion when bonding substrates in such a way as to initiate, following propagation of the first bonding wave normally used for molecular adhesion, propagation of a second bonding wave at an area at least in the vicinity of the point of pressure. In accordance with one embodiment, the second bonding wave is initiated at a location less than about 15 cm from the point of application of pressure. This technique reduces at least a part of the aforementioned distortions. Propagation of the second bonding wave is preferably carried out over an area including the point of application of the pressure used to generate the first bonding wave.

Thus, when propagation of the second bonding wave reaches the area of application of the point of pressure corresponding to the point of initiation of propagation of the first bonding wave, the second bonding wave allows (especially because of a different direction of propagation) the release of constraints caused by the initiation of propagation of the first bonding wave, and thus reduces the distortions in the wafer at the location where the first wave was initiated while achieving bonding by molecular adhesion over the whole surface of the two wafers in contact.

In addition, unlike propagation of the first bonding wave, the initiation of propagation of the second bonding wave in accordance with the invention does not impose new constraints or new distortions on the wafers. In fact, propagation of the second bonding wave is typically initiated while there exists a partial molecular adhesion between the two wafers as a result of propagation of the first bonding wave, wherein the parts of the wafers already bonded show (as explained above) minimum distortions outside the vicinity of the point of pressure. Hence, the initiation of propagation of the second bonding wave may be effected from an area without any constraints and without having to apply pressure at a new point because the molecular adhesion bonding is begun from the area of the existing partial bonding. In other words, propagation of the second bonding wave is typically initiated by closing the bonding interface between the two wafers at a location that is not bonded (or that was reopened) after propagation of the first bonding wave. The second bonding wave may be initiated at a location near a bonding area without constraints between the two wafers.

Figure 2:
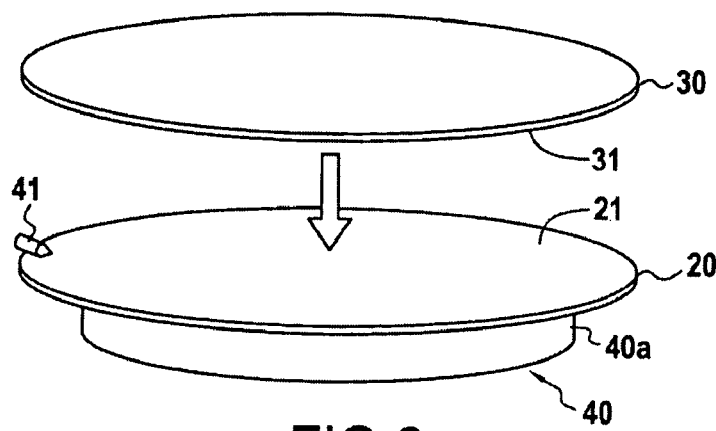
FIGS. 2 to 5 are schematic views of an assembly process by molecular adhesion in accordance with an embodiment of the invention.
Figure 3:
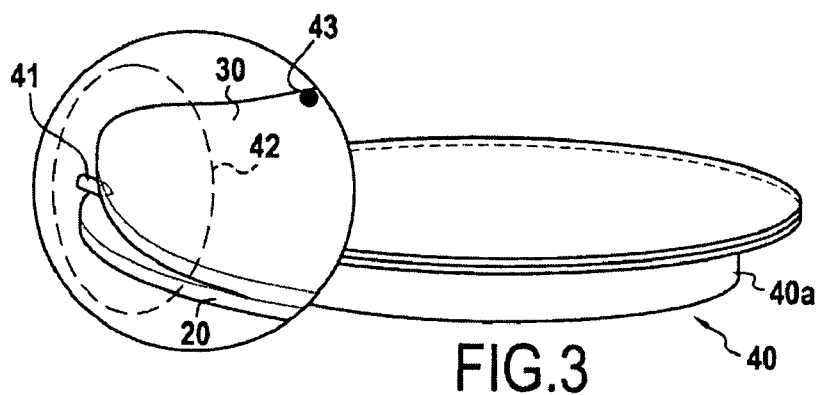

For purposes of illustration, and not limitation, a first embodiment of an assembly process in accordance with the invention will now be described with reference to FIGS. 2-5. As depicted in FIG. 2, a first wafer or substrate 20 is placed in a bonding machine comprising a substrate-supporting device 40. The substrate-supporting device 40 includes a supporting plate 40a which supports the first wafer 20 (for example, by means of an electrostatic or suction system) connected with a support plate 40a with the aim of assembling first wafer 20 through molecular adhesion to a second wafer or substrate 30. As explained above, the surfaces 21 and 31 and the wafers 20 and 30 which are to be bonded are prepared (e.g., by polishing, cleaning, hydrophobic/hydrophilic processing, etc.) to allow molecular adhesion, as known in the art. The surfaces 21, 31 of the wafers 20, 30 are then placed in close contact with one another with the exception of an area 42 where one interposes a separation element between the two wafers in the form of a wedge 41 as shown in FIG. 3.

Figures 4, 5:
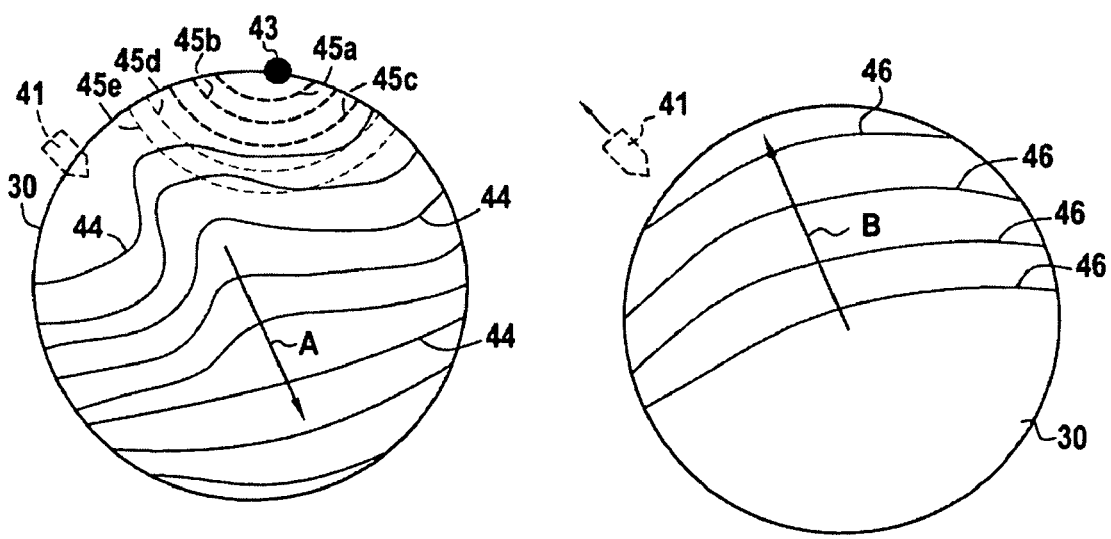

As further depicted in FIG. 4, a first bonding wave 44 is initiated from an initiation point 43 which corresponds to the location of the wafer 30 to which a pressure point is applied, for example, using a Teflon® stylus. The application of a supporting pressure at the point 43 creates constraints around this point represented by lines of constraint 45a to 45e, the intensity of which decreases depending on the distance from the initiation point 43.

The initiation point 43 of the first bonding wave 44 may be located anywhere on the wafer 30. However, in order to have an area with the least possible distortion, the initiation point 43 is preferably located at the edge of the wafer to allow the first bonding wave to be propagated over a large distance in order to form in the part opposite the initiation point, an area with virtually no distortion compared to that located in the vicinity of the initiation point 43. As depicted in FIG. 4, the shape of the first bonding wave 44 gradually becomes more homogeneous as it propagates along direction A from the initiation point 43 towards the opposite end of the wafer 30. As is evident, the constraints responsible for the heterogeneous distortions in the wafer 21 decrease significantly as one moves away from the initiation point 43.

Once the first bonding wave propagates to the opposite end from the initiation point 43, the wedge 41 is removed to close the area 42 and to initiate a second bonding wave 46, which progresses from the bonded area either without (or virtually without) distortion along the direction B as shown in FIG. 5. The second bonding wave provides a structure in the region of the initiation point 43 that is substantially free of distortion. This second bonding wave propagation is used to close complete the interface bonding between the two wafers while correcting distortions created near the initiation point 43 during the propagation of the first bonding wave 44.

The location of the initiation point 43 is preferably chosen to be relatively close to the wedge 41 in order to have the separation of the two plates in an area near the point where pressure was applied. This helps to release the constraints occurring at the pressure point more effectively. If the initiation point is located towards the center of the wafers rather than near their edges, the wedge 41 should be positioned in a place which is closer to the center of the wafers.

According to one embodiment, the separation element, for example the wedge 41, originally positioned at the edge of the wafer may be moved towards the inside of the wafers after initiating the first bonding wave in order to partially unbond the bonded interface. This allows the bonded interface to be opened near or at the initiation point, especially when the separation element is initially placed in an area remote from the initiation point such as in an area located near the center of the wafer.

FIGS. 6 to 10 show another embodiment of an assembly process in accordance with the invention which differs from that previously described, for example, in that the second bonding wave is generated by reopening the bonded interface between the two wafers. More specifically, as shown in FIGS. 6 and 7, surfaces 51 and 61 respectively of first and second wafers or substrates 50, 60 are placed in close contact under the same conditions as described above, wherein the first wafer 50 is held on a supporting plate 70a of a substrate-supporting device 70. Propagation of a first bonding wave 64 is initiated from an initiation point 63 by applying pressure at a point, and the wave is propagated along direction A towards the opposite end of the wafer 50 as illustrated in FIG. 8. The application of a supporting pressure at point 63 creates constraints around point 63 represented by lines of constraints 65a to 65e, the intensity of which decreases as a function of the distance from the initiation point 63.

In this embodiment, no obstacle is positioned between the two wafers so that the molecular adhesion is achieved over the entirety of the bonding interface during propagation of the first bonding wave 64. To initiate the propagation of the second bonding wave, a partial separation is obtained between the two wafers by opening the bonding interface in the area 62 (FIG. 9). The partial un-bonding of the wafers may be achieved, for example, by inserting a blade, for example made of Teflon©, or by applying a jet of fluid (water, air, gas, etc.) to the bonding interface. The partial separation may still be obtained by inserting a wedge like the wedge 41 described above.

The bonding interface may be reopened from a place anywhere at the edges of two wafers. However, the partial unbending between the two wafers is carried out preferably at the initiation point 63. In fact, reopening the bonding interface at the initiation point 63 allows the constraints generated around this point to be released because the portion of the wafer 60 included in the area 62 is no longer bonded to the wafer 50. The length of insertion of the separation element (for example, the blade or wedge) or the power of penetration of the fluid jet will depend on the position of the initiation point on the wafers (near the edge or the center of the wafers).

The unbonded area 62 is then closed to initiate propagation of the second bonding wave 66 which along a direction B as shown in FIG. 10 and allows the complete closure of the bonding interface between the two wafers without distortion. The unbonding/rebonding steps effected to initiate the second bonding wave propagation may be repeated several times, changing the unbonded area (or not as the case may be), in order to minimize even more the constraints and distortions suffered by the wafer 60 or the two wafers 50 and 60.

The process according to embodiments of the invention is applicable to the assembly of all types of material compatible with molecular bonding and in particular semiconductor materials such as silicon, germanium, glass, quartz, and the like. The wafers to be assembled may include only one part with microcomponents.

One area of assembly processes in particular, but not exclusively, using the present invention is the production of three-dimensional structures.

An exemplary process for producing a three-dimensional structure by the transfer of a layer of microcomponents formed on an initial substrate onto a final substrate according to an embodiment of the invention is now described in reference to FIGS. 11A to 11D and 12.

Figure 11A:
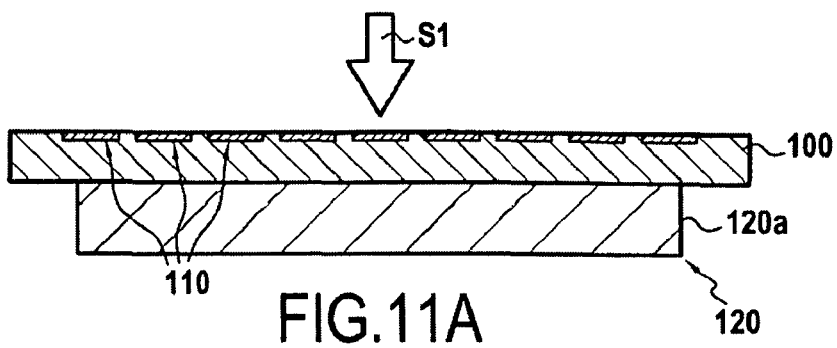
FIGS. 11(A) to 11(D) are schematic views showing the production of a three-dimensional structure in accordance with an embodiment of the invention.

The production of the three-dimensional structure begins with the formation of a first series of microcomponents 110 on the surface of an initial wafer or substrate 100 (FIG. 11A, step S1). The initial substrate 100 may be a single structure, for example, a layer of silicon, or a structure such as a multi-layer structure of the SOI type. The microcomponents 1 10 are formed by photolithography using a mask to define the areas for forming patterns corresponding to the microcomponents 110 to be formed. During formation by photolithography of the microcomponents 110, the initial substrate 100 is held on a substrate-supporting device 120. The substrate-supporting device includes a support plate 120a on which is affixed the initial substrate 100, for example by means of an electrostatic or suction system in connection with the support plate 120a.

The face of the initial substrate 100 including microcomponents 1 10 is then placed in close contact with one side of a final wafer or substrate 200 (step S2) for bonding by molecular adhesion. A layer of oxide, for example $SiO_2$, may also be formed on the face of the initial substrate 100 including microcomponents 110 and/or on the face of the final substrate 200 intended to be placed in close contact.

Propagation of a first bonding wave to allow molecular adhesion between the two substrates is then initiated by applying localized pressure at an initiation point as explained above (step S3). Propagation of a second bonding wave is then initiated in an area located at least near the initiation point of the first bonding wave (step S4).

As explained previously in connection with FIGS. 2 to 5, propagation of the second bonding wave may be initiated by withdrawal of a separation element interposed between the two substrates 100, 200 when initiating propagation of the first bonding wave in order to retain an unbonded area for the initiation of propagation of the second bonding wave. According to another embodiment, which is described above in reference to the FIGS. 6 to 10, propagation of the second bonding wave may be initiated by a partial reopening and closing of the bonding interface acquired during propagation of the first bonding wave.

Figure 11B:
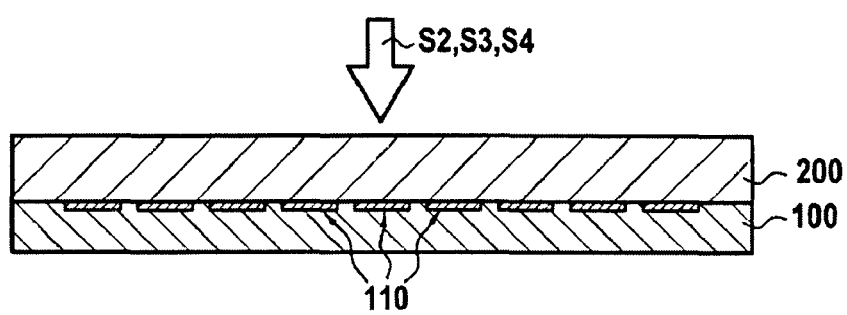

After propagation of the second bonding wave, the initial substrate 100 and final substrate 200 are bonded together by molecular adhesion over their entire surface in contact, without (or with virtually no) distortion in the initial substrate 100 containing the microcomponents 110 (FIG. 11B). One accordingly obtains a buried layer of microcomponents 110 at the bonding interface between the substrates 100 and 200.

Figure 11C:
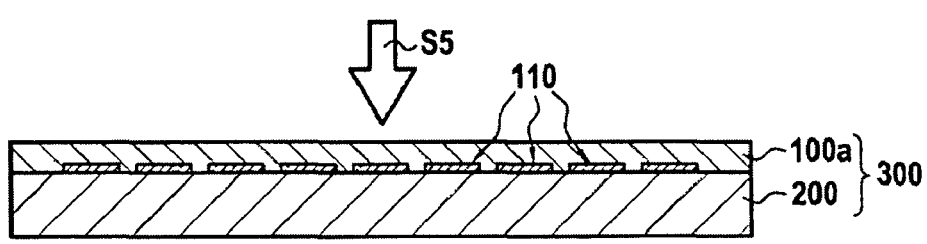

After bonding (and as shown in FIG. 11C), the initial substrate 100 is thinned down to remove a portion of material above the layer of microcomponents 110 (step S5). In the case where the substrate 100 is a type SOI substrate, one may advantageously use a buried insulating layer to delineate the thickness of the remaining layer 100a. The result is a composite structure 300 formed from the final substrate 200 and a layer 100a corresponding to the remaining portion of the initial substrate 100. The initial substrate 100 may be thinned down especially by chemical-mechanical polishing (CMP), by chemical engraving, or splitting or fracturing along a plane of weakness previously formed in the substrate, for instance by atomic implantation.

Figure 11D:
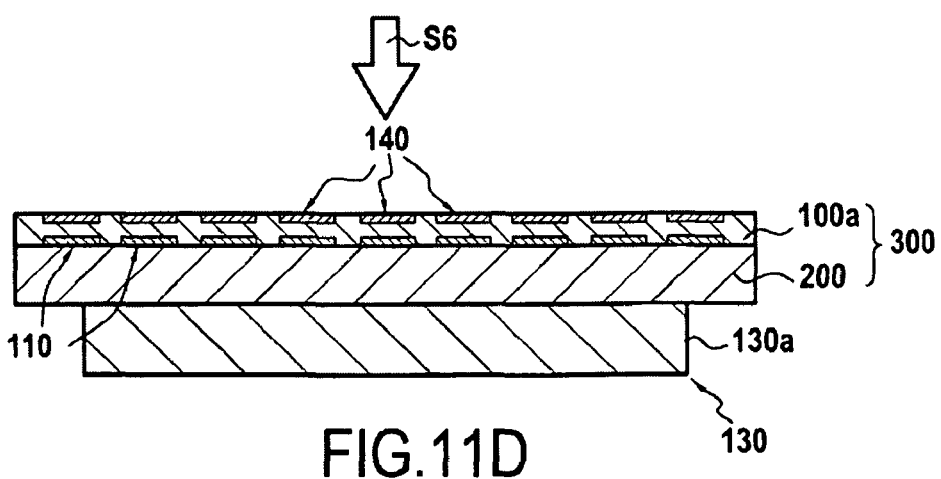
Figure 12:
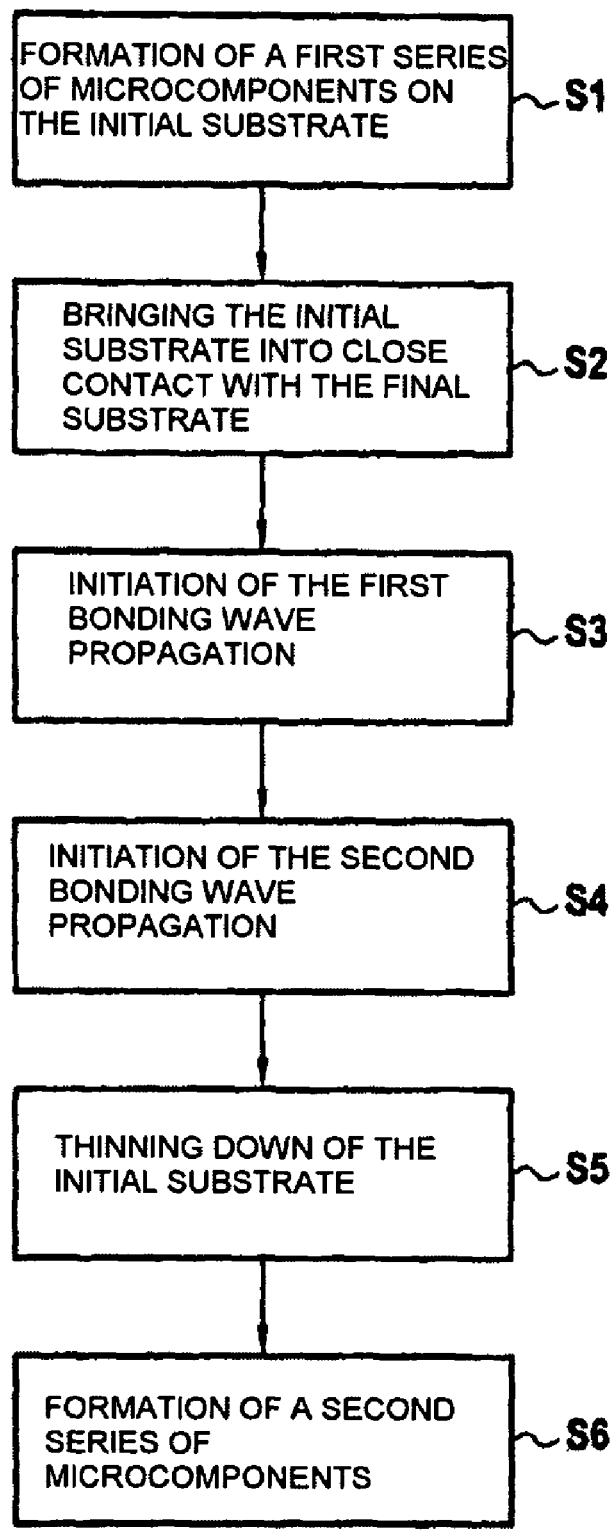
FIG. 12 is an exemplary organizational plan for carrying out the production of the three-dimensional structure depicted in FIGS. 11(A)-11(D).

As shown in FIG. 11D, the next step in the production of the three-dimensional structure is to form a second layer of microcomponents 140 on the exposed surface of the thinned-down initial substrate 100 (FIG. 11D, step S6). In order to form the microcomponents 140 in alignment with the buried microcomponents 110, a photolithography mask similar to that used to form the microcomponents 110 may be used. In the same way as for the formation of the microcomponents 110, the composite structure 300, formed from the final substrate 200 and the layer 100a, is held on a support plate 130a of a substrate-supporting device 130 which is identical to the device 120. The photolithography mask is then applied to the free surface of the layer 100a.

In another embodiment, the three-dimensional structure is formed by a stack of layers, each layer having been assembled in accordance with the assembly process of this invention, and each layer being in alignment with the layers directly adjacent to it.

As a result of the assembly process by molecular adhesion of the invention, the initial substrate 100 can be bonded to the final substrate without distortion or at least with a reduction of such distortion while one can no longer see a significant misalignment of the microcomponents 110 before and after the transfer of the initial substrate 100 onto the final substrate 200. One can thus reduce the residual misalignment values below 200 nm or 100 nm evenly over the surface of the wafer. The microcomponents 140, even in very small sizes (for example<1 μm) may be easily formed in alignment with the microcomponents 110, even after the transfer of the initial substrate.

The assembly process of this invention, therefore, allows the elimination of the phenomenon of misalignment ("overlay") during the transfer of a circuit layer onto another layer or a support substrate in order to produce wafers of multilayer semiconductors of a very high quality.

The methods and systems of the present invention, as described above and shown in the drawings, provide for a semiconductor structure with improved properties. It will be apparent to those skilled in the art that various modifications and variations can be made in the device and method of the present invention without departing from the spirit or scope of the invention. Thus, it is intended that the present invention include modifications and variations that are within the scope of the appended claims and their equivalents.

What is claimed is:

1. A molecular adhesion bonding process comprising:
    a) bringing two layers of material to be bonded into at least partial contact;
    b) propagating a first bonding wave by applying pressure to a first location on one of the layers of material; and
    c) propagating a second bonding wave toward a second location, wherein the second bonding wave propagates over an area including the first location.

2. The process of claim 1, further comprising partially unbonding the layers in the vicinity of the first location prior to propagation of the second bonding wave.

3. The process of claim 1, wherein the first location is proximate an edge of the two layers of material.

4. The process of claim 1, further comprising introducing a separation element between the layers of material prior to initiating the first bonding wave, wherein the separation element is removed to initiate propagation of the second bonding wave.

5. The process of claim 4, wherein the separation element is moved from a periphery of the layers toward an inner region of the layers after propagation of the first bonding wave and before propagation of the second bonding wave.

6. A process for making a composite three-dimensional structure comprising:
    a) forming a first layer of microcomponents on a first face of a first substrate; and
    b) bonding the first face of the first substrate with a second substrate, wherein the bonding step includes:
        i) bringing the two substrates into at least partial contact;
        ii) propagating a first bonding wave by applying pressure to a first location on one of the substrates; and
        iii) propagating a second bonding wave toward a second location, wherein the second bonding wave propagates over an area including the first location.

7. The process of claim 6, further comprising forming a second layer of microcomponents on a second face of the first substrate, wherein the second face is opposed to the first face.

8. The process of claim 6, further comprising forming an oxide layer on the first face of the first substrate prior to the bonding step.

9. The process of claim 6, wherein the first substrate includes a SOI structure.

10. The process of claim 6, wherein the first layer of microcomponents includes image sensors.

11. The process of claim 6, wherein the second substrate includes transparent material.

12. The process of claim 6, further comprising thinning the first substrate.

13. The process of claim 12, wherein the thinning step occurs after the bonding step.

* * * * *